United States Patent [19]
Wolstenholme et al.

[11] Patent Number: 5,751,012
[45] Date of Patent: May 12, 1998

[54] POLYSILICON PILLAR DIODE FOR USE IN A NON-VOLATILE MEMORY CELL

[75] Inventors: Graham R. Wolstenholme, Boise; Philip J. Ireland, Nampa, both of Id.

[73] Assignee: Micron Technology, Inc., Boise, Id.

[21] Appl. No.: 474,028

[22] Filed: Jun. 7, 1995

[51] Int. Cl.$^6$ .......................... H01L 47/00; H01L 29/06; H01L 27/10; H01L 29/00
[52] U.S. Cl. ................ 257/5; 257/2; 257/4; 257/37; 257/209; 257/530; 365/163
[58] Field of Search ............... 257/2, 3, 4, 530, 257/209, 37, 5; 365/163

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 257/5 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,502,208 | 3/1985 | McPherson | 29/584 |
| 4,569,698 | 2/1986 | Feist | 148/1.5 |
| 4,597,162 | 7/1986 | Johnson et al. | 29/574 |
| 4,752,118 | 6/1988 | Johnson | 350/334 |
| 4,757,359 | 7/1988 | Chiao et al. | 357/23.5 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/5 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,510,629 | 4/1996 | Karpovich et al. | 257/50 |

FOREIGN PATENT DOCUMENTS

| | | | |
|---|---|---|---|
| 0 117 045 | 8/1984 | European Pat. Off. | H01L 45/00 |
| 60109266 | 6/1985 | Japan | H01L 27/10 |
| 1 319 388 | 6/1973 | United Kingdom | H01L 9/00 |

OTHER PUBLICATIONS

Neale and Aseltine, "The Application of Amorphous Materials to Computer Memories," *IEEE*, 20(2):195–205, 1973. no month.

Pien and Plummer, "Performance of the 3-D Sidewall Flash EPROM Cell," *IEDM* 93, 11–14, 1993. no month.

(List continued on next page.)

*Primary Examiner*—Valencia Martin Wallace
*Attorney, Agent, or Firm*—Fletcher & Associates

[57] ABSTRACT

There is described a memory cell having a vertically oriented polysilicon pillar diode for use in delivering large current flow through a variable resistance material memory element. The pillar diode comprises a plurality of polysilicon layers disposed in a vertical stack between a wordline and digitline. The memory element is disposed in series with the diode, also between the wordline and the digitline. The diode is capable of delivering the large current flow required to program the memory element without also requiring the surface space on the upper surface of the memory matrix normally associated with such powerful diodes. The invention allows memory cells to be disposed every 0.7 microns or less across the face of a memory matrix. Further, the memory cell is easily fabricated using standard processing techniques. The unique layout of the inventive memory cell allows fabrication with as few as three mask steps or less.

24 Claims, 6 Drawing Sheets

OTHER PUBLICATIONS

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451,1991. no month.

Post et al., "Polysilicon Emitters for Bipolar Transistors: A Review and Re–Evaluation of Theory and Experiment," *IEEE*, 39(7):1717–1731, 1992. no month.

Post and Ashburn, "The Use of an Interface Anneal to Control the Base Current and Emitter Resistance of p–n–p Polysilicon Emitter Bipolar Transistors," *IEEE*, 13(8):408–410, 1992. no month.

Rose et al., "Amorphous Silicon Analogue Memory Devices," *J. Non–Crystalline Solids*, 115:168–170, 1989. no month.

Schaber et al., "Laser Annealing Study of the Grain Size Effect in Polycrystalline Silicon Schottky Diodes," *J. Appl. Phys.*, 53(12):8827–8834, 1982. no month.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992. no month.

Yeh et al., "Investigation of Thermal Coefficient for Polycrystalline Silicon Thermal Sensor Diode," *Jpn. J. Appl. Phys.*, 31(Part 1, No. 2A):151–155, 1992. no month.

Oakley et al., "Pillars–The Way to Two Micron Pitch Multilevel Metallisation," Plassey Research (Caswell) Limited, Allen Clark Research Centre. no date.

5,751,012

POLYSILICON PILLAR DIODE FOR USE IN A NON-VOLATILE MEMORY CELL

BACKGROUND OF THE INVENTION

The present invention relates generally to the use of variable resistance memory materials in semiconductor devices. More particularly, the invention relates to the formation of a polycrystalline silicon ("polysilicon") pillar diode that may be used in conjunction with a variable resistance memory element to form a memory cell for use in a electronic memory array.

The use of programmable variable resistance materials, such as chalcogenide, amorphous silicon, and antifuse, in electronic memories is known in the art. The use of chalcogenide, for example, is described in U.S. Pat. No. 5,296,716, No. 5,335,219, No. 5,341,328, and No. 5,359,205, all to Ovshinsky et al., which are incorporated herein by reference. These patents are believed to evidence the state of the prior art and to represent current theory of operation and function of chalcogenide materials and chalcogenide-based memories known to those skilled in the art.

Briefly, variable resistance materials are materials that can be caused to change physical state, and therefore resistivity level, in response to an electrical input stimulus. By way of example, chalcogenides are materials that may be electrically stimulated to change states and resistivities, from an amorphous state to a crystalline state, for example, or to change resistivites while in a crystalline state. A chalcogenide material may be predictably placed in a particular resistivity state by running a current of a certain amperage through it. The resistivity state so fixed will remain unchanged unless and until a current having a different amperage within the programming range is run through the chalcogenide material.

Because of these unique characteristics, variable resistance memory materials may be used in memory cells for storing data in binary or higher-based digital systems. Such memory cells will normally include a memory element that is capable of assuming multiple, generally stable, states in response to the application of a stimulus. In most cases, the stimulus will be a voltage differential applied across the element so as to cause a predetermined current to flow through the memory element. A chalcogenide-based memory cell will typically include a chalcogenide memory element for storing data and an access element, coupled to the memory element, for use in programming and sensing the stored data. The access element may be, in one embodiment, a diode. A chalcogenide-based memory cell will typically be accessible to external circuitry by the selective application of voltages to a wordline and a digitline, as are conventionally used in semiconductor memories.

Because of the unique operating characteristics of memories based on variable resistance memory elements, control of current flow is crucial to facilitate programming. Programming of chalcogenide, for example, requires very high current densities. In this regard, it is desirable that a chalcogenide-based memory cell include a diode capable of forcing a large current flow in the forward direction, while allowing only a small current flow in the reverse direction. Conventional junction diode structures that are large enough to supply the necessary current require so much space on the upper surface of the silicon substrate that they would negate the space-saving advantages of using chalcogenide in electronic memories. Additionally, such large diodes in the prior art have required complicated processing, thereby increasing the number and complexity of processing steps required for manufacture. Accordingly, there is a need for a small, easily manufactured diode that can meet the performance requirements of chalcogenide-based memory cells.

SUMMARY OF THE INVENTION

The present invention provides a memory cell based on variable resistance material memory element, and including a polysilicon pillar diode for use in delivering suitable programming current to the memory element. The pillar diode comprises a plurality of polysilicon layers stacked directly above a first address line and directly below the memory element. The diode is easily constructed using conventional techniques and a minimal number of masking steps. In this way, a highly effective diode can be easily and efficiently created for delivering a suitable programming current while minimizing the size of the memory cell.

BRIEF DESCRIPTION OF THE DRAWINGS

The feature and advantages of the present invention will be best appreciated with reference to the following detailed description and the accompanying drawings, in which.

DETAILED DESCRIPTION OF THE PREFERRED EMBODIMENTS

Figure 1:
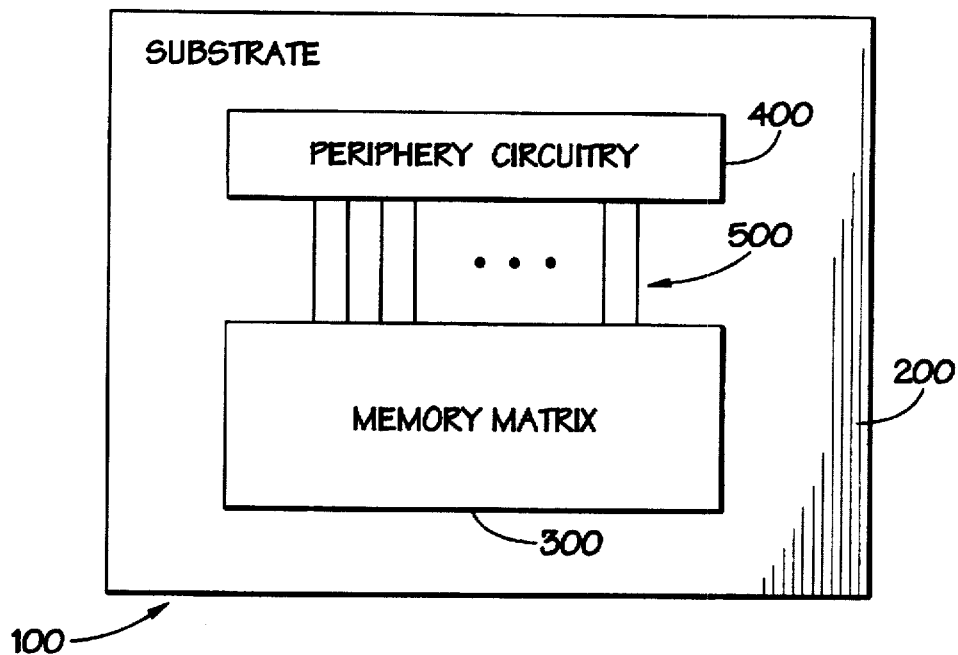
FIG. 1 is a schematic representation of an exemplary substrate having a memory matrix formed thereon in electrical communication with periphery circuitry.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined in the appended claims.

FIG. 1 is a schematic depiction of the electrical memory 100 that is the subject of the present invention. Electrical memory 100 comprises semiconductor substrate 200 with memory matrix 300 and periphery circuitry 400 formed thereon. Memory matrix 300 comprises a plurality of memory cells for storing data, as described below. Periphery circuitry 400 comprises circuitry for addressing the memory elements located in memory matrix 300 and storing data therein or retrieving data therefrom. In this regard, periphery circuitry 400 may include circuitry for regulating the voltage level applied across each memory cell in order to determine which of the multiple possible resistivity levels will be programmed into that cell. Memory matrix 300 and addressing matrix 400 are in electrical communication via electrical connection 500. It is envisioned that all components of memory 100 can be formed integrally across substrate 200. It is further envisioned that the processing steps required to form memory matrix 300 can be a part of a single process flow (e.g., a CMOS flow) used to form periphery circuitry 400 and electrical connection 500 so that a completely addressable and accessible memory 100 is formed by a single process flow.

Figure 2:
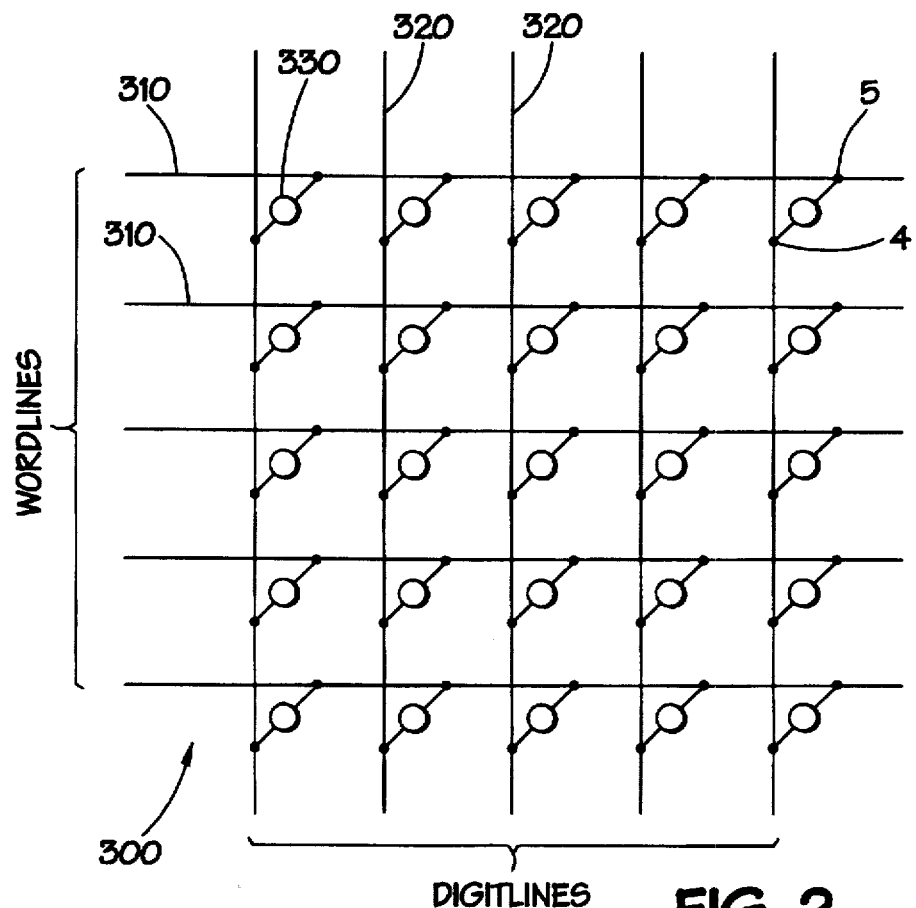
FIG. 2 is a representation of an exemplary memory matrix formed by a plurality of memory cells disposed between the wordlines and digitlines in accordance with one embodiment of the present invention.

FIG. 2 schematically depicts an exemplary memory matrix 300. Memory matrix 300 comprises a plurality of horizontally disposed wordlines 310 and vertically disposed digitlines 320 (collectively, "address lines"). Each memory cell 330 is disposed between a wordline 310 and a digitline 320. Each memory cell 330 has a wordline node 5 and a digitline node 4 connected as shown. Wordlines 310 and digitlines 320 are electrically coupled to addressing matrix 400, in a manner well known in the art, so that each memory cell 330 can be uniquely addressed and accessed as needed. In the embodiments discussed herein, the normal state of wordline 310 is a low voltage and the normal state of digitline 320 is a high voltage, although these conventions could be altered without departing from the principles and features of the present invention. When a particular memory cell 330 is being written to, the voltages on the wordline 310 and digitline 320 corresponding to that cell 330 are set up such that a high voltage is seen across memory cell 330 (from digitline 320 to wordline 310).

Figure 3:
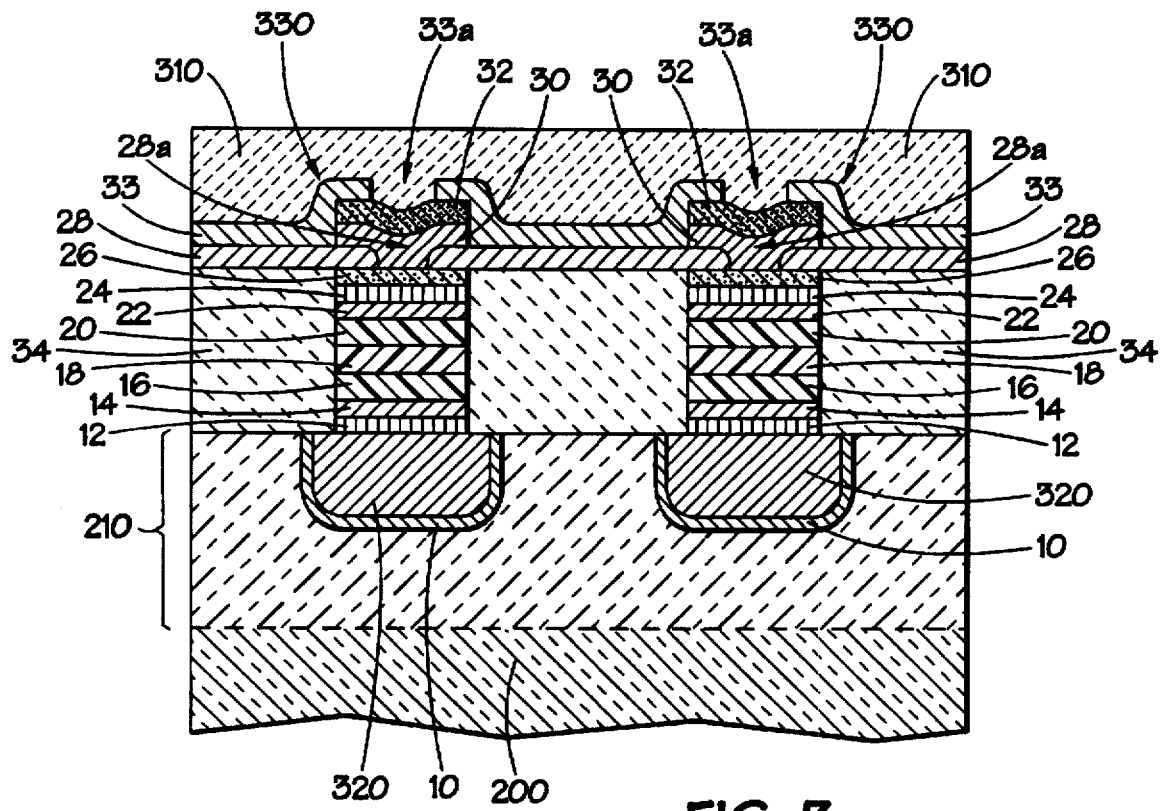
FIG. 3 is a cross-sectional view of two neighboring chalcogenide-based memory cells constructed according to one embodiment of the present invention.

FIG. 3 shows a cross-section of memory matrix 300 including two memory cells 330 constructed according to the present invention. Memory matrix 300 is formed on substrate 200, which is preferably a p-type substrate. Oxide base 210 is a thick oxide layer preferably approximately 1 micron deep formed on substrate 200.

Digitline 320 is a tungsten layer formed in a trench recessed into oxide base 210. Digitline 320 runs in a plane perpendicular to the cross-section shown, tying together all memory cells 330 disposed along that digitline 320. A trench coating 10 of TiN or another material, approximately 200 angstroms thick, may be deposited in the trench before digitline 320 is formed. Just as digitline 320 runs in a plane perpendicular to the cross-section, wordline 310 runs in the plane parallel to the cross-section, tying together all memory cells 330 disposed along that wordline 310 (including the two memory cells 330 shown). This construction gives rise to the plurality of overlapping wordlines and digitlines depicted in FIG. 2.

Memory cell 330 is physically and electrically disposed between digitline 320 and wordline 310. Immediately above digitline 320 are a TiN layer 12 and a Ti layer 14 that may be deposited to reduce resistance in memory cell 330. First poly layer 16 is disposed above Ti layer 14 and is preferably an N+ layer of polysilicon that serves to prevent the formation of a Schottky diode at the poly-metal boundary. Second poly layer 18 is disposed above first poly layer 16 and is preferably an N− layer of polysilicon. Third poly layer 20 is disposed above second poly layer 18 and is preferably an P+ layer of polysilicon. Immediately above third poly layer 20 are Ti layer 22 and TiN layer 24 that may be deposited to reduce resistance in memory cell 330. Lower electrode 26 is disposed above TiN layer 24 and preferably comprises a metal layer and a carbon layer, with the carbon layer being disposed between the metal layer and the chalcogenide. Lower electrode 26 is for making electrical contact with chalcogenide layer 30. Upper electrode 32 is disposed above chalcogenide layer 30 and is preferably a metal layer and a carbon layer, the two layers for making electrical contact between wordline 310 and chalcogenide layer 30. The metal layer may be omitted since wordline 320 may be a metal layer. Electrodes 26 and 32 may be formed of other materials, but will preferably have a layer of material selected to serve as a diffusions barrier preventing undesirable contamination of chalcogenide layer 30. Shaping layer 28 is preferably a nitride layer that serves to contour chalcogenide layer 30 so as to create a chalcogenide active area 28a in the center of memory cell 330. Cap layer 33 is preferably a nitride layer that serves to cap off memory cell 330 and to define a contact opening 33a directly above the chalcogenide active area 28a.

Many chalcogenide alloys may be suitable for use in chalcogenide layer 30 in connection with the present invention. Preferably, the chalcogenide composition will be formed from tellurium, selenium, germanium, antimony, bismuth, lead, strontium, arsenic, sulfur, silicon, phosphorous, oxygen, and mixtures or alloys of these elements. These alloys will be selected so as to create a material capable of assuming multiple, generally stable, states in response to the stimulus applied. An exemplary chalcogenide alloy suitable for use in the present invention is an alloy of tellurium, germanium, and antimony, combined in approximate proportions of 55:22:22, respectively.

Generally speaking, the portion of memory cell 330 disposed between digitline 320 and TiN layer 24 is the pillar diode, while the portion disposed between lower electrode 26 and wordline 310 is the memory element. Thus, memory cell 330 comprises a memory element in series with a pillar diode. Disposed above oxide base 210, surrounding and separating neighboring pillars, is an oxide filler 34 to insulate memory cell 330 from other memory cells 330.

The operation of memory cell 330 is now described. When the voltage on wordline 310 is biased above that on digitline 320, the diode is forward biased and current flows through chalcogenide layer 30, causing a change in its physical state (i.e., the crystallinity), and thus, its resistivity, if the current is within the programming range for the particular chalcogenide composition used. When the voltage biases on wordline 310 and digitline 320 are reversed, the diode is switched "off" and no current flows. The amount of current produced across chalcogenide layer 30 is a product of the voltage difference between the wordline 310 and the digitline 320. This can be an important issue, especially since chalcogenide-based memory cells may be used not only as binary storage devices, but also as multilevel (higher base number system) storage devices. Thus, the precise amount of current flow is an important control parameter for operation of memory cell 330 that will preferably be controlled by periphery circuitry 400.

Figure 4:
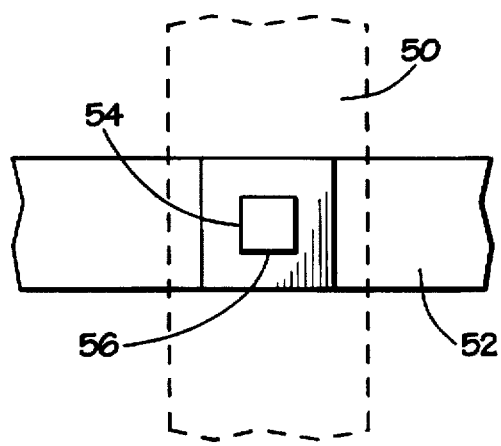
FIG. 4 is an view showing the relative sizes of the features of the memory cell according to one embodiment of the present invention.

FIG. 4 is a top view showing the relative sizes of the features of memory cell 330 according to the present invention. This view will help one skilled in the art to visualize the physical layout of the unique structure disclosed herein and understand the discussion of fabrication techniques that follows. Digitline pattern 50 is a long line corresponding to digitline 320. Likewise, wordline pattern 52 is a long line corresponding to wordline 310. Pillar pattern 54 is a square area that corresponds to the footprint of the pillar diode comprising first, second and third poly layers 16, 18 and 20. Pillar pattern 54 is shown having a smaller width than digitline pattern 50 (corresponding to the relative sizes represented in FIG. 3); however, these patterns 50 and 54 could have the same width. Contact pattern 56 is a square area corresponding to contact opening 33a and active area 28a. In one embodiment, digitline pattern 50 is 1 micron across, pillar pattern 54 is 0.65×0.65 microns, and contact pattern 56 is 0.35×0.35 microns. Digitline pattern can be 0.65 microns, as it is not necessary that digitline 320 be wider than the rest of memory cell 330. It will be recognized that patterns 50, 52, 54, and 56 correspond to the masks used in the fabrication of memory cell 330, as discussed below.

Figure 5:
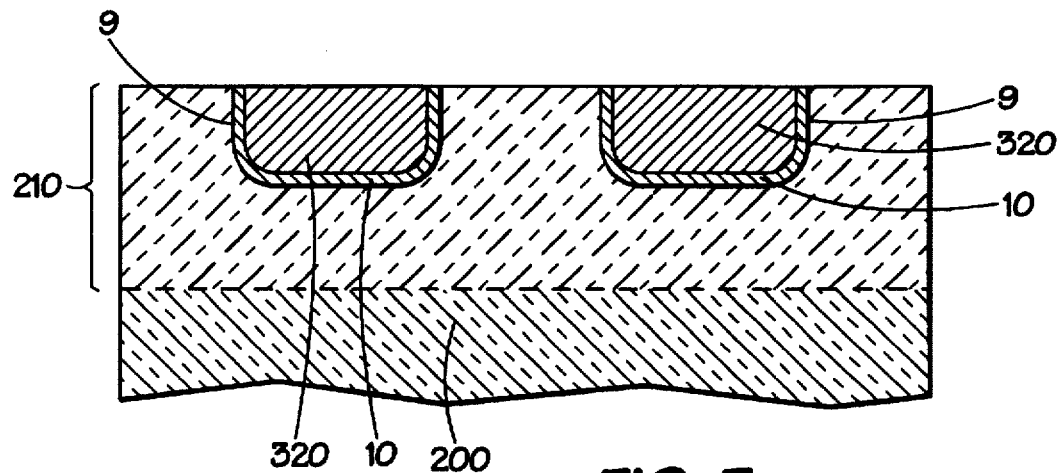
FIG. 5 is a cross-sectional view of an in-process memory cell according to the embodiment shown in 3, showing the formation of digitlines in a base.

The formation of the memory cell 330 shown in FIG. 3 is now described in detail. With reference first to FIG. 5, an oxide base 210 is formed on substrate 200 using conventional techniques. The preferred method for fabricating oxide base 210 is planarized deposited oxide. Oxide base 210 is selectively etched to form the long parallel trenches 9 (running into the page) that will contain digitline 320. These trenches 9 can be formed using a mask corresponding to digitline pattern 50 shown in FIG. 4. Once the trench 9 is formed, a TiN trench coating 10 can be deposited. Digitline 320 may be formed by a tungsten fill process. For example, a layer of tungsten may be deposited to fill the trench, followed by a CMP step to remove the tungsten from the surface of oxide base 210.

Figure 6:
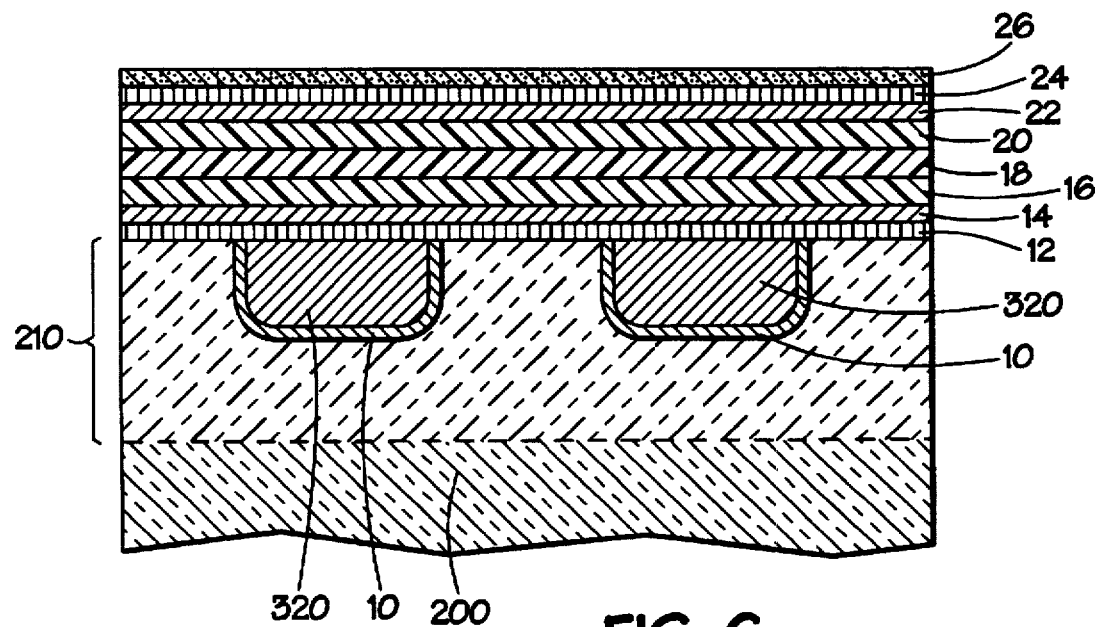
FIG. 6 is a cross-sectional view of an in-process memory cell according to the embodiment shown in FIG. 3, showing the deposition of a plurality of silicon layers above the base.

FIG. 6 illustrates how the pillar diode is formed by a plurality of layers disposed above digitline 320. Layer 12 (preferably a TiN layer) and layer 14 (preferably a Ti layer) may be deposited between digitline 320 and the plurality of poly layers 16, 18, and 20. Layers 12 and 14 improve the electrical contact between digitline 320 and poly layers 16, 18 and 20, but layers 12 and 14 are not necessary to the functioning of memory cell 330. Next, first poly (preferably N+ material), second poly (preferably N− material) and third poly (preferably P+ material) layers 16, 18 and 20 are deposited, using conventional techniques, preferably to depths of 2000 angstroms, 5000 angstroms, and 2000 angstroms, respectively. Together, poly layers 16, 18 and 20 comprise the operative portion of the pillar diode. Those skilled in the art will recognize that more or fewer poly layers can be used to form the pillar diode, and that other poly material types may be used to achieve the desired current throughput. For example, first poly layer 16 (of N+ material) may be omitted altogether. Also, the polarities on each layer 16, 18 and 20 could be reversed (together with the polarities of other related features of memory cell 330). Next, a Ti layer 22 and a TiN layer 24 are deposited above third poly layer 20. Layers 22 and 24 serve the purpose of improving electrical contact between lower electrode 26 and poly layers 16, 18 and 20, but layers 22 and 24 are not necessary to the functioning of memory cell 330. At this point, all of the layers required for the formation of the pillar diode have been deposited. However, before a mask and etch step are performed, lower electrode 26 is deposited. Lower electrode 26 is preferably composed of a carbon layer and a metal layer, such as TiN.

Figure 7:
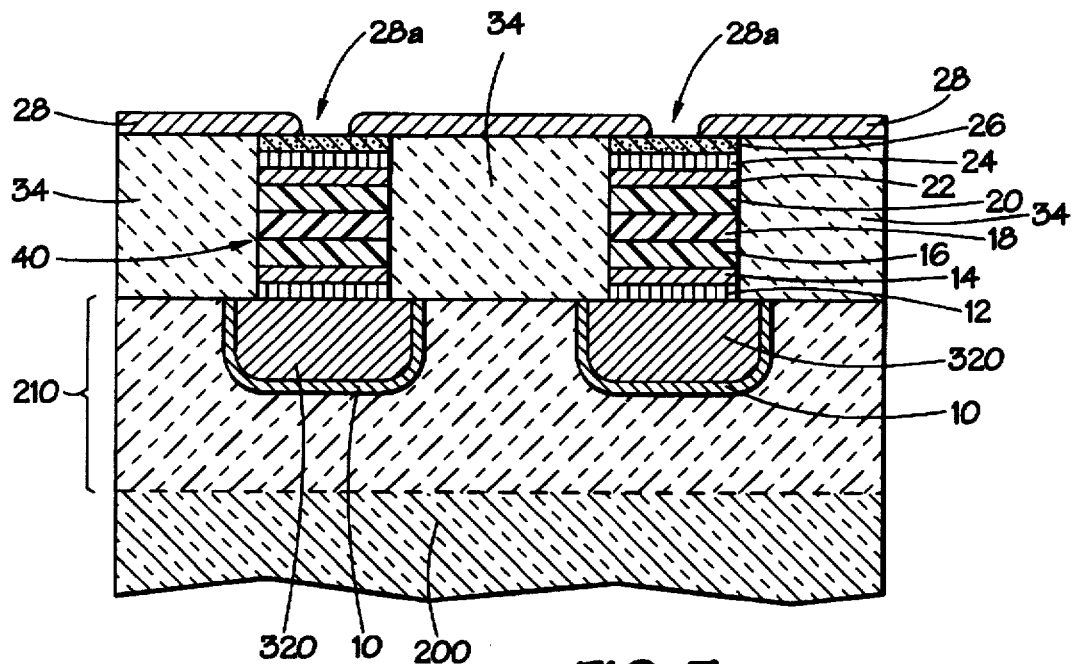
FIG. 7 is a cross-sectional view of an in-process memory cell according to the embodiment shown in FIG. 3, showing the formation of pillars and deposition of a shaping layer.

FIG. 7 illustrates how the layers disposed above digitline 320 are selectively etched to form a pillar 40. A single mask step can be used to define the entire pillar 40. The mask used corresponds to pillar pattern 54 shown in FIG. 4. It will be recognized that this masking step is the second one required so far in the processing of memory cell 330 (the first being the mask required to define digitline 320). After the pillar mask is formed, etching is accomplished using an anisotropic etch that is selective to the oxide.

Next, an oxide filler 34 is formed in the regions separating neighboring pillars 40. This oxide filler 34 is preferably formed using a TEOS process. Next, a shaping layer 28 is formed on top of oxide filler 34. As is illustrated, shaping layer 28 defines active area 28a that will allow electrical contact between chalcogenide layer 30 (see FIG. 3) and lower electrode 26. Shaping layer 28 is formed by depositing nitride layer, preferably about 300 angstroms thick, that electrically isolates neighboring regions. This nitride layer can be selectively etched away using a mask that corresponds to contact pattern 56 shown in FIG. 4.

Figure 8:
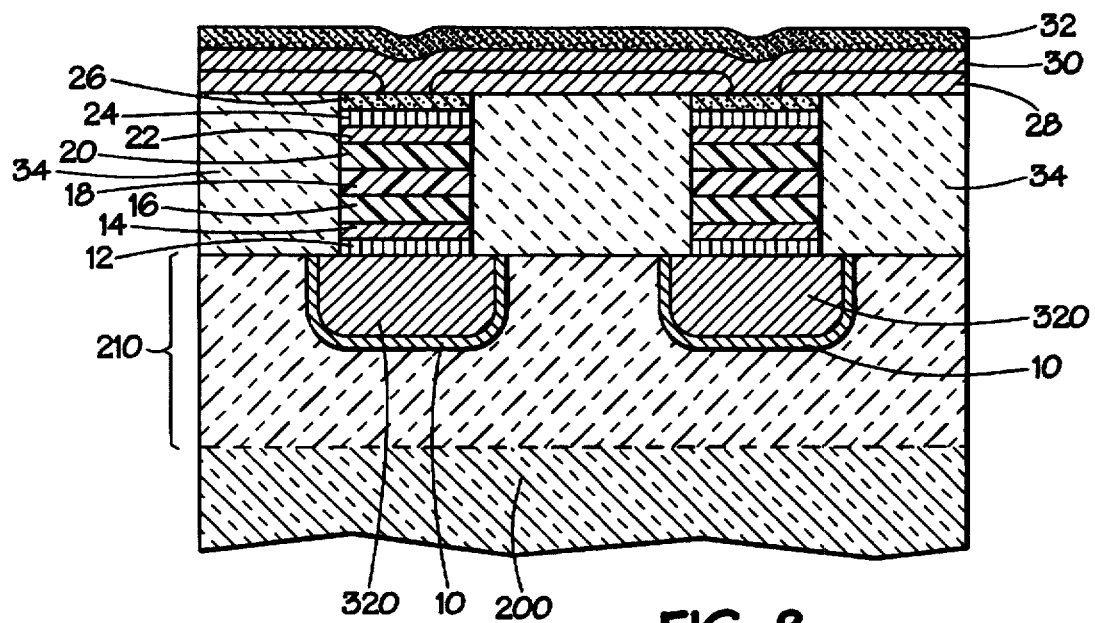
FIG. 8 is a cross-sectional view of an in-process memory cell according to the embodiment shown in FIG. 3, showing the formation of a chalcogenide memory element.

FIG. 8 illustrates the formation of the memory element portion of memory cell 330. First, chalcogenide layer 30 is deposited above shaping layer 28. Chalcogenide layer 30 is preferably 500 angstroms deep. As can be seen, chalcogenide layer 30 is contoured to the shape of shaping layer 28 so that chalcogenide layer 30 comes into electrical communication with lower electrode 26 at openings 29. This creates the active area 28a for the chalcogenide memory element. Upper electrode 32, which is preferably a carbon layer, is formed above chalcogenide layer 30.

Figure 9:
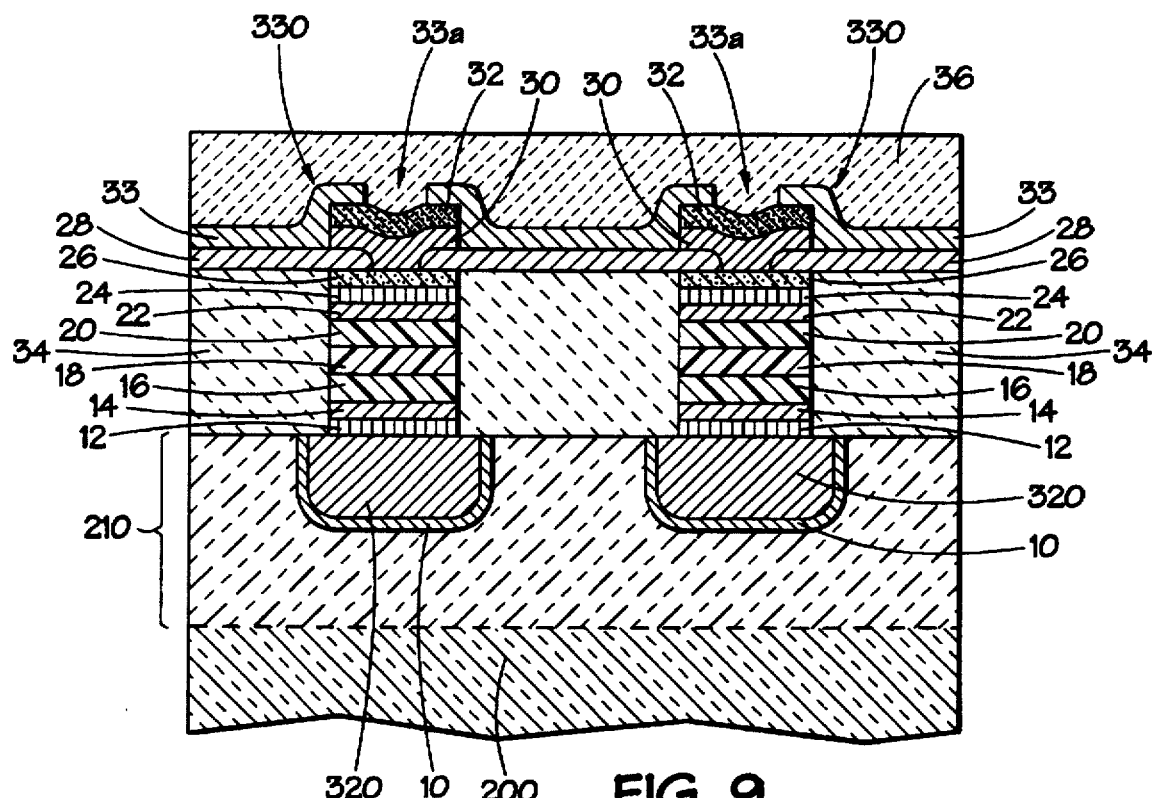
FIG. 9 is a cross-sectional view of an in-process memory cell according to the embodiment shown in FIG. 3, showing the formation of an oxide cover in which wordlines can be disposed.

FIG. 9 illustrates the completion of memory cell 330. First, chalcogenide layer 30 and upper electrode 32 are patterned using selective etching. The mask used for this etch step corresponds to the pillar pattern 54 shown in FIG. 4. Next, a cap layer 33 is formed by depositing a nitride layer of about 500 angstroms and selectively etching the nitride to define contact openings 33. The mask used to define contact openings 33a corresponds to contact pattern 56, shown in FIG. 4. Next, an oxide cover 36 is formed across the top of memory matrix 300.

In a final processing sequence, oxide cover 36 is selectively etched to define wordline trenches running the length of memory matrix 300 in the plane of the cross-section shown. The mask used for defining these wordline trenches corresponds to wordline pattern 52, shown in FIG. 4. Wordline 310 is formed in the wordline trench etched into oxide cover 36 by performing a tungsten fill process. Alternatively, wordline 310 may be an aluminum line without the trench. Wordline 310 is shown disposed above memory cell 330 in FIG. 3.

The advantages of the embodiment shown in FIG. 3 can now be understood. Memory cell 330 comprises a diode capable of delivering the large current throughput required for operation of a chalcogenide memory element. Memory cell 330 accomplishes this performance objective without requiring a large amount of surface space on the upper surface of memory matrix 300. With reference to FIG. 4, it can be seen that each memory cell 330 need not be any larger than pillar pattern 54 (this is because digitline pattern 50 can be reduced to the same width as pillar pattern 54). Pillar pattern 54 can be made 0.65 microns square or smaller. Assuming a 0.35 micron space between neighboring cells 330, one memory cell 330 can be disposed every 1.0 micron across the face of memory matrix 300.

In addition to the space savings realized by the present invention, there are other advantages to the inventive memory cell 330. First, fabrication of memory matrix 300 requires only conventional processing techniques that are well known in the art. Moreover, processing time is saved because formation of memory cell 330 can be accomplished with a minimum number of masking steps. The embodiment of memory cell 330 shown in FIG. 3 requires only six mask steps for processing (digitline, diode pillar, active area opening, chalcogenide pillar, contact opening, wordline). Other embodiments require even fewer masking steps.

Figure 10:
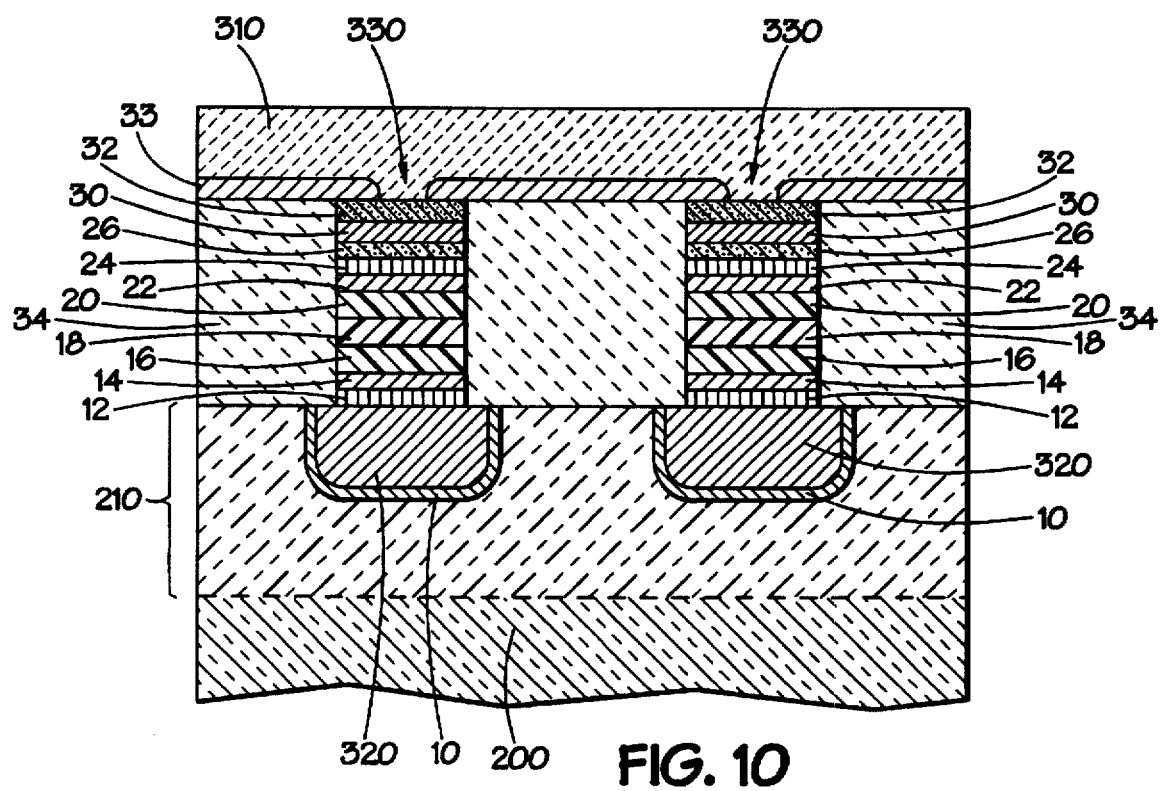
FIG. 10 shows an alternative embodiment of the memory cell of the present invention.

FIG. 10 shows an alternate embodiment of memory cell 330. The main difference between this embodiment and the one shown in FIG. 3 is that chalcogenide layer 30 and upper electrode 32 are disposed directly above lower electrode 26. This change eliminates the need for shaping layer 28 (see FIG. 3) and the masking step required to form that layer. In addition, this embodiment eliminates the need for a separate masking step to form chalcogenide layer 30 and upper electrode 32. Instead, these layers can be formed using the same masking step used to define the rest of the pillar in memory cell 330. In total, this embodiment requires only four masking steps (digitline, pillar, nitride contact, and wordline). Again, assuming that digitline pattern 50 is 0.65 microns wide, pillar pattern 52 is 0.65 micron square, wordline pattern 54 is 0.65 microns wide, and contact pattern 56 is 0.35 microns square, and assuming a cell spacing of 0.35 microns, one memory cell 330 can be disposed every 1 micron across memory matrix 300.

Figure 11:
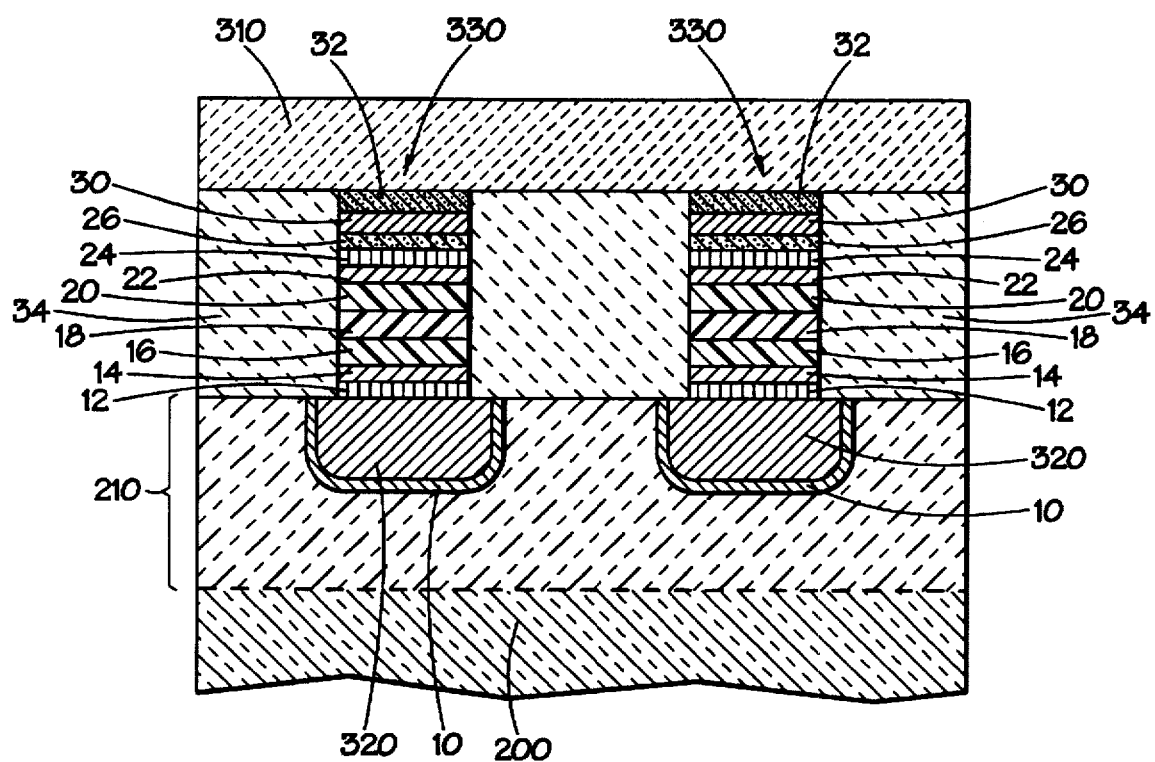
FIG. 11 shows another alternative embodiment of the memory cell of the present invention.

FIG. 11 shows yet another embodiment of memory cell 330. The main difference between this embodiment and the one shown in FIG. 10 is that cap layer 33 is removed along the entire length of the trench after the trench is formed and before wordline 310 is formed. This change eliminates the need for the masking step required to form contact opening 33a. Instead, wordline 310 comes into direct contact with upper electrode 32 or a contact disposed thereon. This embodiment requires only three masking steps (digitline, pillar, and wordline). This embodiment has the further advantage that now the pillar pattern 54 can be reduced to a 0.35 micron square or smaller. In this way, the effective active area of the chalcogenide (the region in which the chalcogenide is in electrical communication with wordline 310) may be maintained at 0.35 microns×0.35 microns. At this size, one memory cell 330 can be disposed every 0.7 microns across memory matrix 300, assuming a spacing of 0.35 microns.

Many modifications and variations may be made in the techniques and structures described and illustrated herein without departing from the spirit and scope of the present invention. Accordingly, it should be understood that the methods and apparatus described herein are illustrative only and are not limiting upon the scope of the present invention.

We claim:

1. A memory cell having a first and second nodes, said cell comprising:

a memory element having a layer of programmable resistive material bounded by a first electrode and a second electrode, said memory element electrically coupled to said first node; and a diode formed by depositing at least three silicon layers on a substrate and by selectively etching through said silicon layers to form a distinct pillar of silicon layers, said diode being electrically coupled to said memory element and to said second node, and said silicon layers comprising an N− layer, an N+ layer, and a P+ layer.

2. The memory cell of claim 1, wherein said programmable resistive material is chalcogenide.

3. The memory cell of claim 1, wherein said pillar is disposed above said first node, and wherein said memory element is disposed above said pillar, and wherein said second node is disposed above said memory element.

4. The memory cell of claim 1, wherein said first node is disposed in an oxide base and wherein said pillar is disposed on said oxide base.

5. The memory cell of claim 1, wherein said diode further comprises at least one layer of material that reduces the resistance of said diode in operation, said layer being formed during formation of said pillar.

6. The memory cell of claim 1, wherein said memory cell further comprises a shaping layer disposed between said layer of programmable resistive material and said pillar, said shaping layer contouring said layer of programmable resistive material to at least partially define an active area where said layer of programmable resistive material is in electrical contact with said diode.

7. The memory cell of claim 1, wherein said memory cell further comprises a cap layer disposed between said second node and said memory element, said cap layer contouring said second node to at least partially define a contact opening where said second node is in electrical contact with said memory element.

8. The memory cell of claim 1, wherein at least some of said silicon layers are polysilicon layers.

9. A memory matrix comprising:

a plurality of first address lines;

a plurality of second address lines;

a plurality of diodes being formed by depositing at least three silicon layers on a substrate and by selectively etching through said silicon layers to form a plurality of pillars of silicon layers, wherein each of said pillars forms a diode, wherein said silicon layers comprise an N− layer an N+ layer, and a P+ layer, and wherein each of said plurality of pillars has a first end and a second end, the first end of each of said plurality of pillars being coupled to a respective one of said plurality of first address lines; and a plurality of memory elements, each of said plurality of memory elements having a first electrode coupled to said second end of a respective one of said plurality of pillars, a second electrode coupled to a respective one of said plurality of second address lines, and a layer of programmable resistive material coupled between said first electrode and said second electrode.

10. The matrix of claim 9, wherein said plurality of first address lines contain tungsten.

11. The matrix of claim 10, wherein said plurality of first address lines are disposed in a plurality of trenches recessed in an oxide base.

12. The matrix of claim 11, wherein said plurality of trenches are coated with a layer material effective to lower electrical resistance experienced by said first address lines during operation.

13. The matrix of claim 9, wherein each of said plurality of diodes is disposed above a respective first address line, and wherein each memory element is disposed above a respective diode, and wherein each of said plurality of second address lines is disposed above a respective memory element.

14. The memory matrix of claim 9, wherein each of said plurality of diodes further comprises at least one layer effective to reduce electrical resistance experienced by said diode during operation.

15. The memory matrix of claim 9, further comprising a shaping layer disposed between each of said plurality of diodes and said respective layer of programmable resistive material, said shaping layer contouring said layer of programmable resistive material to define an active area.

16. The memory matrix of claim 15, wherein said shaping layer is a nitride layer.

17. The memory matrix of claim 9, further comprising a cap layer disposed between each of said plurality of memory elements and said respective second address line, said cap layer contouring said second address line to define an active area.

18. The memory matrix of claim 15, wherein said cap layer is a nitride layer.

19. A memory cell comprising:
   a memory element having a first electrode and a second electrode, and having a layer of programmable resistive material being electrically coupled to said first electrode and to said second electrode; and
   a diode being formed by a pillar comprised of at least three silicon layers being disposed on a substrate, said silicon layers comprising an N− layer, an N+ layer, and a P+ layer, and said diode being electrically coupled to said memory element.

20. A memory matrix comprising:
   a plurality of first address lines;
   a plurality of second address lines;
   a plurality of diodes, each of said plurality of diodes being formed by a pillar comprised of at least three silicon layers, wherein said silicon layers comprise an N− layer, an N+ layer, and a P+ layer; and
   a plurality of memory elements, each of said plurality of memory elements having a layer of resistive material being electrically coupled to a respective one of said plurality of diodes.

21. A memory cell having a first and second nodes, said cell comprising:
   a memory element having a layer of programmable resistive material bounded by a first electrode and a second electrode, said memory element electrically coupled to said first node; and
   a diode formed by depositing at least three silicon layers and a TiN layer on a substrate and by selectively etching through said silicon layers and said TiN layer to form a distinct pillar, said diode being electrically coupled to said memory element and to said second node.

22. A memory matrix comprising:
   a plurality of first address lines being disposed in a plurality of trenches recessed in a dielectric base, said plurality of trenches being coated with a layer of TiN;
   a plurality of second address lines;
   a plurality of diodes being formed by depositing at least three silicon layers on a substrate and by selectively etching through said silicon layers to form a plurality of pillars of silicon layers, wherein each of said pillars forms a diode, and wherein each of said plurality of pillars has a first end and a second end, the first end of each of said plurality of pillars being coupled to a respective one of said plurality of first address lines; and
   a plurality of memory elements, each of said plurality of memory elements having a first electrode coupled to said second end of a respective one of said plurality of pillars, a second electrode coupled to a respective one of said plurality of second address lines, and a layer of programmable resistive material coupled between said first electrode and said second electrode.

23. A memory cell comprising:
   a memory element having a first electrode and a second electrode and having a layer of programmable resistive material coupled to said first electrode and said second electrode; and
   a diode coupled to said memory element and formed by a distinct pillar comprising a plurality of silicon layers and a layer of TiN.

24. A memory matrix comprising:
   a plurality of first address lines;
   a plurality of second address lines;
   a plurality of diodes being formed by depositing on a substrate a plurality of silicon layers and a layer of TiN and by selectively etching through said plurality of silicon layers to form a plurality of pillars of silicon layers, wherein each of said plurality of pillars forms a diode, and wherein each of said plurality of pillars has a first end and a second end, the first end of each of said plurality of pillars being coupled to a respective one of said plurality of first address lines; and
   a plurality of memory elements, each of said plurality of memory elements having a first electrode coupled to said second end of a respective one of said plurality of pillars, a second electrode coupled to a respective one of said plurality of second address lines, and a layer of resistive material coupled to said first electrode and to said second electrode.

* * * * *